United States Patent [19]

Epperson et al.

[11] Patent Number: 5,423,078
[45] Date of Patent: Jun. 6, 1995

[54] DUAL MODE POWER AMPLIFIER FOR ANALOG AND DIGITAL CELLULAR TELEPHONES

[75] Inventors: Darrell Epperson, Wake Forest; Paul W. Dent, Cary, both of N.C.

[73] Assignee: Ericsson GE Mobile Communications Inc., Research Triangle Park, N.C.

[21] Appl. No.: 33,323

[22] Filed: Mar. 18, 1993

[51] Int. Cl.[6] ............................................. H04B 1/40
[52] U.S. Cl. ...................................... 455/89; 455/93; 455/95; 455/102; 455/127; 330/297; 307/110
[58] Field of Search ................... 455/127, 54.1, 89, 74, 455/93, 110, 33.1, 42, 102, 95, 126; 370/95.3, 77; 375/67, 71; 330/297, 129, 127; 363/59, 60; 307/110; 379/59

[56] References Cited

U.S. PATENT DOCUMENTS

| | | |
|---|---|---|
| 3,806,862 | 4/1974 | Chao . |
| 3,962,591 | 6/1976 | Popka ........................ 363/60 |
| 4,291,369 | 9/1981 | Hochstrate ...................... 363/60 |
| 4,446,440 | 5/1984 | Bell . |
| 4,924,191 | 5/1990 | Erb et al. . |
| 5,020,076 | 5/1991 | Cahill et al. . |
| 5,060,294 | 10/1991 | Schwent et al. . |
| 5,132,895 | 7/1992 | Kase ........................... 307/110 |
| 5,175,871 | 12/1992 | Kunkel ......................... 455/127 |
| 5,179,353 | 1/1993 | Miyake ......................... 330/129 |
| 5,235,289 | 8/1993 | Kunitomo ...................... 455/127 |
| 5,239,275 | 8/1993 | Leitch ......................... 455/127 |
| 5,251,331 | 10/1993 | Schwent et al. ................. 330/297 |
| 5,276,917 | 1/1994 | Vankannen et al. .............. 455/127 |

OTHER PUBLICATIONS

39th IEEE Vehicular Technology Conference, vol. 1, May 1989.
20th European Microwave Conference 90, vol. 1, Sep. 1990.

Primary Examiner—Reinhard J. Eisenzopf
Assistant Examiner—Nguyen Vo
Attorney, Agent, or Firm—Nixon & Vanderhye

[57] ABSTRACT

The present invention relates generally to RF power amplifiers for portable cellular radiotelephones, and more particularly, to dual-mode cellular radiotelephones. A power supply network enables the RF power amplifier in a dual-mode radiotelephone to operate with two separate modes: saturated and unsaturated. Switches in the power supply network, e.g. complementary transistors, are driven to a first set of logic states by a square wave which is synchronized with transmit time slots present in a TDMA frame structure to charge a capacitor from a battery. When the switches are then driven to a second set of logic states, the capacitor is placed in series with the battery to essentially double the supply voltage. When the radiotelephone operates in a digital mode, the increased supply voltage coincides with the transmit time slot and temporarily increases the saturation point of the RF power amplifier to permit linear amplification. When the radiotelephone operates in an analog mode, the switches are fixed at the first set of logic states. The resulting lower supply voltage lowers the saturation point of the RF power amplifier, causing it to operate in a nonlinear but more efficient mode.

29 Claims, 4 Drawing Sheets

DUAL MODE POWER AMPLIFIER FOR ANALOG AND DIGITAL CELLULAR TELEPHONES

BACKGROUND AND SUMMARY OF THE INVENTION

Analog cellular telephone systems have been established for many years. The typical analog single carrier per caller (SCPC) system uses frequency modulated (FM), 25 kHz wide radio channels whose carriers are separated by 30 kHz. Unfortunately, increased use of existing analog cellular systems has resulted in corresponding increases of call blocking—particularly in congested urban areas. Recently, it has become advantageous to increase the capacity of existing frequency spectrum allotted by the FCC for cellular communications using time division multiple access (TDMA) techniques. TDMA is a digital communication method that permits plural voice channels to be transmitted as a series of digital codes interleaved on a single carrier.

In a TDMA system, a single RF carrier is divided into logical time frames of a predefined length. Each frame is further divided into plural time slots, e.g. six, with each time slot potentially representing a separate channel. Most time slots are used to transmit subscriber voice or data information. Remaining time slots a Fe usually provided to transmit control information. Thus, if even just two subscribers can use the same carrier frequency, then the cellular system capacity is essentially doubled.

Because of the obvious advantages of digital communication techniques like TDMA, there has been a move to abandon existing analog cellular systems in favor of more powerful digital cellular systems. However, there is already a significant investment in the existing analog SCPC infrastructure. As a result, a new standard has been adopted which supports both the existing analog SCPC format and the digital TDMA format. The dual-mode standard, known as the IS-54, requires that dual-mode mobile telephones be operable in either an analog or a digital communications mode.

The IS-54 standard for analog communication uses frequency modulation (FM). Because FM is a constant envelope modulation scheme, the modulated information not sensitive to variations of carrier amplitude and therefore may be amplified without loss or distortion information by a nonlinear amplifier operating in saturation. For digital communications the IS-54 standard requires a modulation scheme known as π/4-shifted (Differentially encoded Quadrature Phase Shift Keying) which more efficiently uses the allocated frequency spectrum. However, π/4-shifted DQPSK performs some amplitude modulation of the transmitted signal, therefore, distortion of the signal amplitude cause,. nonlinear amplification cannot be tolerated. Accordingly, in digital TDMA systems, linear amplifiers must be used.

Linear operation infers that for every decibel change in drive power, the output power changes exactly the decibel amount. Moreover, linear operation faithfully reproduces the drive signal without distortion or unwanted spurious products and occurs as long as operation is restrained below the saturation point of the amplifier.

Amplifiers are often classified according to the conditions under which the transistor operates, i.e., according to the portion of the AC signal voltage cycle during which the transistor output current flows as controlled by the bias on the base or gate of the transistor. The four classes of amplifier operation a Fe generally recognized as A, B, AB, and C. In class A operation, the transistor operating point is biased near the midpoint of the linear portion of the transistor characteristic curve. The RF signal input causes the transistor output to vary above and below that operating point. The transistor conducts throughout the entire input signal cycle with the transistor output being directly proportional to the input signal. In other words, the transistor operates within the linear portion of its characteristic curve to provide linear amplification. The principal characteristics of class A amplifiers are minimum distortion, and relatively low efficiency, e.g. 20 to 25%.

In class B operation, the transistor is biased near its cutoff value. The RF input signal drives the transistor into cutoff for approximately half of a cycle. Thus, the transistor conducts for about 180° of the input signal cycle and is cutoff during the other 180°. In class AB operation, the transistor conducts for greater than 180° but less than 360°. Such amplifiers are characterized by medium efficiency, e.g. 40–60%. In class C operation, the transistor is biased into cutoff so that the transistor conducts appreciably less than 180°. Thus, the transistor remains turned off for most o f each input signal cycle, and the transistor output is a series of pulses. Although class C amplifiers distort the input signal, they have a high efficiency, e.g. 70 to 80%.

Because of their low distortion and high efficiency, class AB amplifiers are best suited for the π/4- shifted DQPSK modulation used in the digital communications mode as described above. Although the operating or Q-points of class AB type amplifiers are set for linear operation, at some saturation point their operation becomes nonlinear. That saturation point may be achieved by driving the amplifier with an input voltage signal having a magnitude sufficient to "clip" the output voltage. As a result, the output waveform resembles, depending on the degree of clipping, a square wave rather than a sinusoidal wave.. Clipping occurs when the peak voltage swing of the output signal attempts to exceed the supply voltage to the amplifier.

A square wave output provides more efficient amplifier operation because the transition time between voltage maximum/current minimum and voltage minimum/current maximum conditions is minimized. Since power is dissipated only during that transition time, the amplifier operates more efficiently when saturated. Changing the supply voltage to a linear amplifier changes the saturation point. Thus, by controlling the supply voltage, both linear and nonlinear operation can be achieved.

Figure 1A:
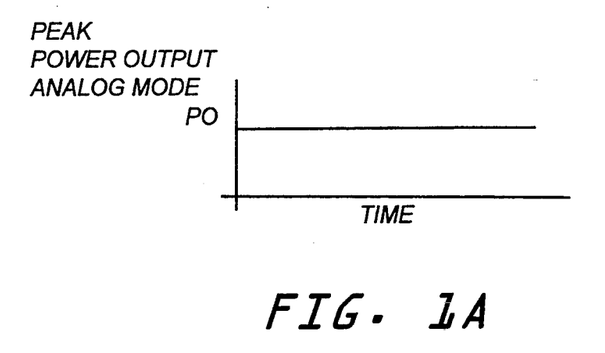
FIGS. 1(a) and 1(b) are graphs illustrating the relationship between peak and average power for the digital and analog modes of operation of a dual-mode portable radiotelephone.
Figure 1B:
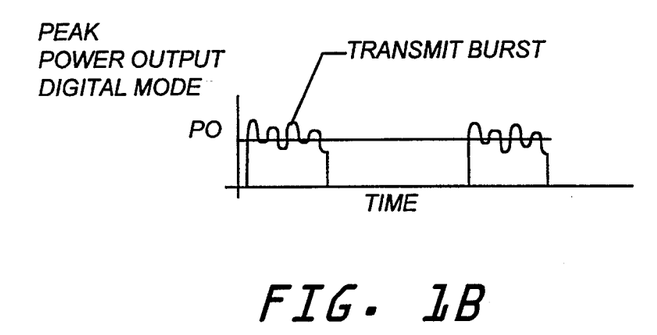

The dual-mode IS-54 standard requires that the average power output over a standard time period in the digital mode be equal to the average power output in the analog mode. Referring to FIG. 1(a)-1(b), it is evident that the peak power output in the analog mode is a constant power value $P_O$. In contrast, digital transmissions occur as amplitude varying bursts during allotted time slots as shown in FIG. 1(b). Therefore, the peak power required of a power amplifier in a mobile telephone in the digital mode necessarily must be larger in the digital mode than in the analog mode to achieve the same average power output.

While a single unsaturated linear amplifier could be used in both digital and analog modes, efficiency power are unacceptably sacrificed when operating in the analog mode where the peak power requirement is significantly lower than-that required in the digital mode. Moreover, in the analog mode, the battery life of the dual-mode mobile is unnecessarily shortened. Battery life in mobile telephones corresponds directly to talk time, and talk time is a significant factor in consumer differentiation of competing products.

Two separate RF power amplifiers could be used—one for the analog mode and one for the digital mode—to maximize efficiency and therefore battery life. While the use of two separate RF power amplifiers may address the problem of efficiency, this approach significantly increases the cost and size of portable radiotelephones.

What is needed is a means for maximizing the efficiency of a dual-mode portable radiotelephone without significantly increasing the cost and size of that radiotelephone.

The present invention provides a single power amplifier for a portable, dual-mode radiotelephone with high efficiency amplification when operating in the analog mode and linear amplification when operating in the digital mode. In the dual-mode radiotelephone, control of the power provided from a power supply network permits the single power amplifier to operate in two different modes: a saturated mode to permit high efficiency, low power consumption operation in the analog mode and an unsaturated mode to permit linear operation in the digital mode. Specifically, the power supply network permits high efficiency nonlinear amplification for constant RF envelope modulated signals and linear amplification of input signals which have been modulated using modulation techniques that vary, at least to some extent, the amplitude of the RF carrier.

The power supply according to the present invention for providing different voltage levels to an RF power amplifier in a mobile radio telephone specifically may include a battery; complementary transistors oppositely biased by a drive signal, where the drive signal has two logic states; and a capacitor connected between the transistors such that the capacitor is alternately placed in parallel with the battery when the drive signal is at a first logic state and in series with the battery when the drive signal is at a second logic state. A diode is connected between the capacitor and the transistors to prevent discharge of the capacitor through the transistors.

A first voltage is generated by the power supply when the drive signal is at the first logic state and a second voltage is generated by the power supply when the drive signal is at the second logic state. The drive signal may be generated using the TDMA frame structure and synchronization signals of the digital portion of the dual-mode radiotelephone to achieve the two different modes of amplifier operation (analog and digital) accurately and inexpensively. In one embodiment, the complementary transistors include an NPN bipolar transistor and a PNP bipolar transistor where the base terminals of the transistors are connected to the drive signal, the emitter of the PNP transistor is connected to the DC voltage source and the anode to the diode and the cathode to the diode is connected to the collectors of both the transistors via a capacitor. Alternatively, complementary N-type and P-type field effect transistors (FET's) can be used in place of bipolar transistors, often with lower losses.

The power supply network according to the present invention may also employ plural dc voltage sources for providing different voltage levels of dc power to drive a RF power amplifier in linear and nonlinear modes depending on the voltage level supplied. Plural switches connected to the dc voltage sources are actuable in accordance with the drive signal to provide different dc power voltage levels. A capacitor is connected by the switches such that the capacitor is alternately placed in parallel with the plural dc voltage sources and in series with one of the plural dc voltage sources depending on the actuation states of the switches. A diode is connected to the capacitor to prevent discharge through the switches.

BRIEF DESCRIPTION OF THE DRAWINGS

The foregoing and other objects, features, and advantages of the present invention will be apparent from the following more detailed description of preferred embodiments as illustrated in the accompanying drawings in which reference characters refer to the same parts throughout the various views. The drawings are not necessarily to scale, emphasis instead being placed upon the illustrating principals of the invention.

DETAILED DESCRIPTION OF THE DRAWINGS

Figure 2:
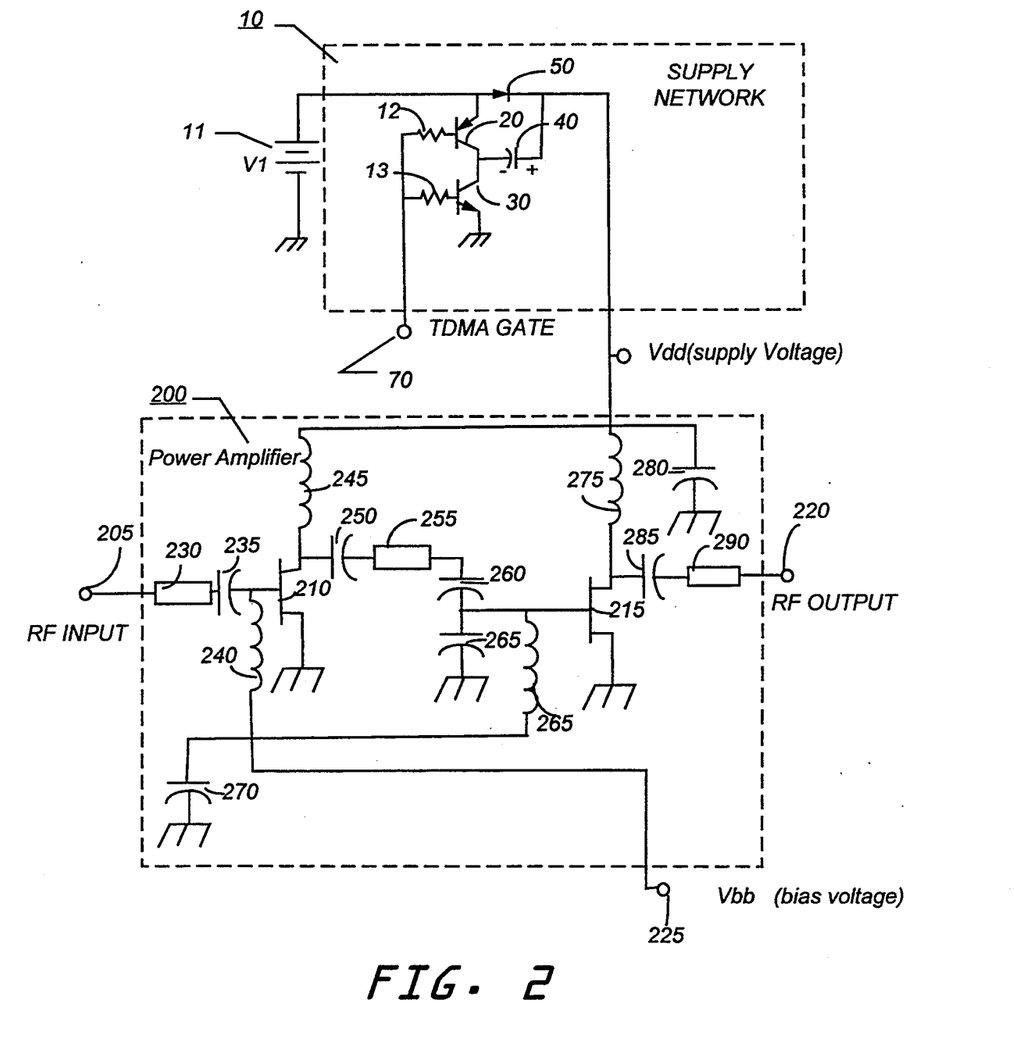
FIG. 2 is a schematic drawing showing a preferred embodiment of the present invention.

FIG. 2 shows a power supply network 10 and a power amplifier 200 for use in a dual-mode portable radiotelephone according to the present invention.

The power supply network 10 includes a battery 11 having a DC voltage V1 which typically may be on the order of six volts. The battery 11 is connected at its positive terminal to the emitter terminal of a PNP bipolar junction transistor 20 and the anode of a diode 50. The collector of the PNP transistor 20 is connected to the collector of a complementary NPN bipolar junction transistor 30 whose emitter is connected to ground. Both transistors 20 and 30 have their base terminals connected through corresponding biasing resistors 12 and 13 to a TDMA gate terminal 70 for receiving a drive or bias signal. When the drive signal is in one logic state (e.g. a "low" voltage), transistor 20 is ON and transistor 30 is OFF. If the drive signal is another logic state (e.g. a "high" voltage), transistor 20 is OFF and transistor 30 is ON. Thus, transistors 20 and 30 are "complementary." The collectors of the transistors 20 and 30 are connected through a capacitor 40 to the cathode of the diode 50. The size of the capacitor 40 is determined primarily by the current requirements of the power amplifier 200. Typically, the capacitor 40 is quite large, e.g. 2200 microFarads. The output of the supply network 10 is the supply voltage Vdd provided to the power amplifier 200. Those skilled in the art will appreciate that the transistors 20 and 30 may be implemented using other types of complementary switches, e.g. FETs. Diode 50 could also be replaced with a FET switch.

The RF power amplifier 200 may be any suitable power amplifier which meets the requirements of a particular radio frequency communications application. In the preferred embodiment, such a power amplifier specifically meets the requirements of the IS-54 dual-mode standard and. preferably includes one or more GaAs FET transistors. An RF input signal is received at terminal 205 and connected by way of impedance matching transmission line 230 and DC blocking capacitor 235 to the gate of a field effect transistor 210. A preset bias voltage Vbb is applied via terminal 225 and RF choke 240 to the gate of transistor 10 to set the Q-point of transistor 210 to permit linear operation. The output of transistor 210 is coupled through various matching elements, i.e. capacitors 250, 260, 265, and transmission line 255 to the gate of a second FET transistor 215. Bias voltage to this second FET 215 is provided by $V_{bb}$ via RF choke 295. Capacitor 70 decouples the RF energy on the bias voltage line $V_{bb}$.

The supply voltage Vdd from the power supply network 10 is applied through corresponding RF chokes 245 and 275 to the respective drains of transistors 210 and 215. A bypass capacitor 280 is connected in shunt with the RF chokes 245 and 275 to decouple RF energy from the supply voltage Vdd. The output of the power amplifier is generated at RF output terminal 220 via blocking capacitor 285 and impedance matching transmission line 290.

Figure 3A:
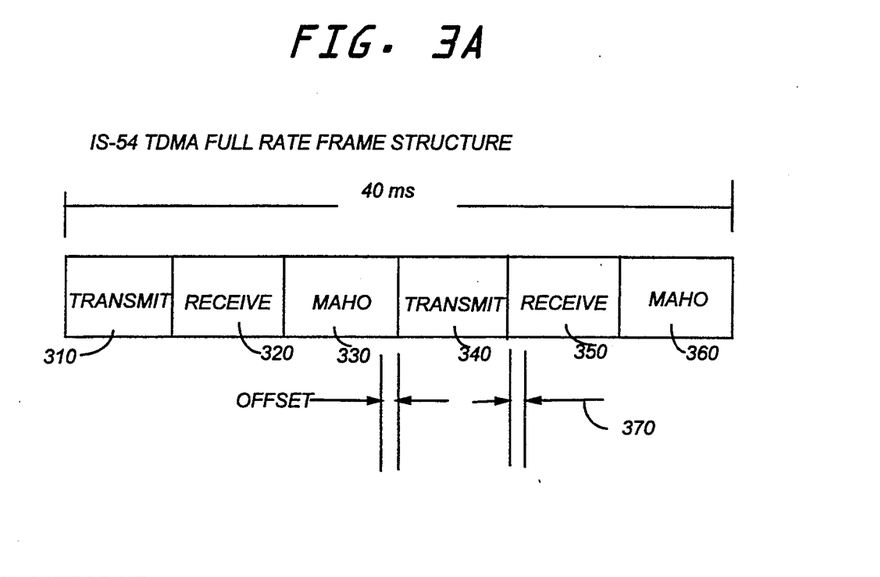
FIGS. 3(a)-3(c) are graphs illustrating the relationship between a TDMA frame structure, a gate drive voltage signal, and an output supply voltage signal according to the present invention.

The operation of the power supply network 10 and power amplifier 200 shown in FIG. 2 will now be described along with FIGS. 3(a)-3(c). The power supply network 10 is controlled by a square wave drive signal applied to the TDMA gate 70 for providing two different supply voltages Vdd to the power amplifier 200. The drive signal applied to the gate 70 is generated in accordance with TDMA frame synchronization signals generated by a conventional microprocessor (not shown) in the radiotelephone. The TDMA frame structure may be, for example, the full rate frame structure shown in FIG. 3(a) where each frame is forty milliseconds and is divided into six time slots 310-360. In the full rate frame structure, each half frame includes a transmit, receive, and mobile-assisted handoff (MAHO) time slot. Those skilled in the art will appreciate that a half rate frame structure could be used as well. A detailed explanation of full and half rate frame structures are set forth in the IS-54 dual-mode standard.

Figure 3B:
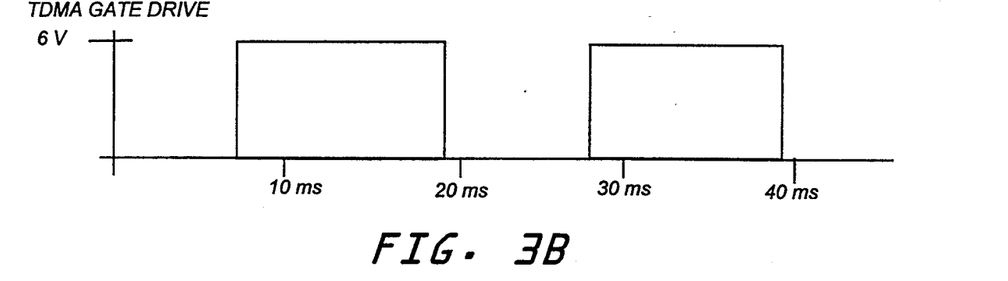
Figure 3C:
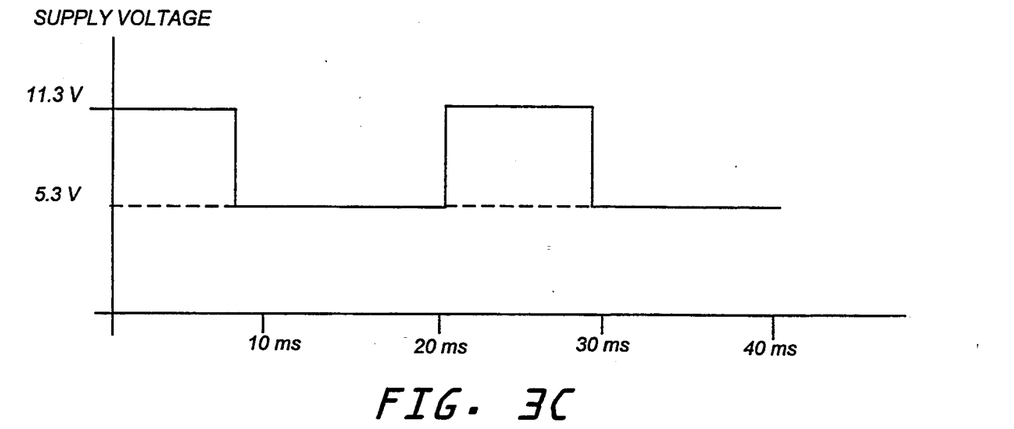

As shown in FIG. 3(b), the TDMA gate drive signal is a square wave having approximately a 66% duty cycle and a frequency of approximately 50 Hz based on a twenty millisecond cycle period (one-half of a TDMA frame). The mobile radiotelephone microprocessor generates the TDMA drive signal synchronized with each transmit time slot. For example, at the beginning of transmit time slot 340, the square wave voltage goes to zero volts, and at the end of transmit time slot 340, the gate drive signal increases to the power supply battery voltage V1. The gate drive signal remains at this voltage V1 (a high logic state) until the end of its cycle. Those skilled in the art will appreciate that the drive signal is not limited to a square wave and other suitable types of drive signals, e.g. sinusoidal, could be used.

Preferably, the falling of the gate signal to a logic low or zero volts is offset by a predetermined offset period 370, e.g. 10 microseconds, from the start of the next transmit burst. This offset period 370 permits the power amplifier transistor(s) to "settle" before transmission in a particular mode.

When the drive signal reaches a logic high V1, the NPN transistor 30 turns on, and the PNP transistor 20 is biased off. In this condition, the capacitor 40 and the battery 11 are connected in parallel across the forward-biased diode 50. Therefore, the supply voltage Vdd to the power amplifier 200 equals the battery voltage V1 less the voltage drop across the diode 50 with the capacitor 40 being charged to the same potential Vdd. These voltages may be expressed as:

$Vdd = V1 - V_{diode}$ $V_{cap} = Vdd = V_{bat} - V_{diode}$

For example, if $V_{bat} = 6.0$ volts and $V_{diode} = 0.7$ volts, $Vdd = V_{cap} = 6.0 \text{ volts} - 0.7 \text{ volts} = 5.3 \text{ volts}$ When the drive signal goes to a logic low, the NPN transistor 30 is turned off, and the PNP transistor 20 is biased on. In this condition, the potential across capacitor 40 reverse biases diode 50 which now is in series with the battery 11. The reverse biased diode 50 prevents capacitor 40 from discharging through the PNP transistor 20. With the diode 50 connected in series with the battery 11, the supply voltage Vdd is equal to the battery voltage V1 plus the reverse biased voltage across the diode 50:

$Vdd = V_{bat} + V_{cap}$

With the battery voltage at the exemplary six volt value used above, $V_{cap}$ equals 5.3 volts. As a result, $Vdd = V_{bat} + V_{cap} = 6.0 + 5.3 = 11.3 \text{ volts.}$ The changes to supply voltage Vdd in response to the drive signal shown in FIG. 3(b) are illustrated in FIG. 3(c).

Figure 4:
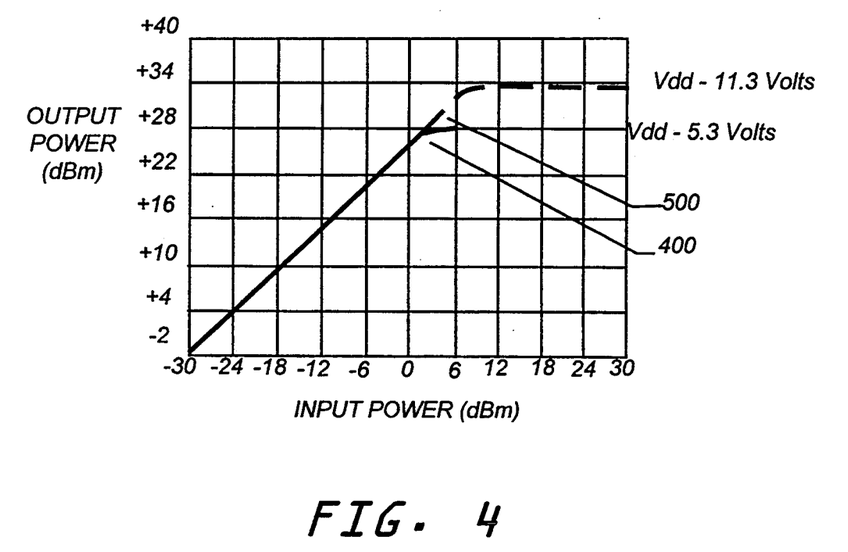
FIG. 4 is a graph illustrating the transfer characteristics of the linear and nonlinear operation of the power amplifier according to the present invention.

FIG. 4 illustrates a graph of transfer characteristics (the ratio of output power to input power) of a dual-mode radiotelephone power amplifier according to the present invention. In the analog mode of operation of the dual-mode radiotelephone, the power amplifier 200 is supplied with a fixed lower supply voltage Vdd produced by the power supply 10 with the TDMA gate 70 held at a high potential, e.g. V1, and the amplifier power transfer characteristic curve 400 is produced (solid line). As described above, this lower supply voltage, e.g. 5.3 volts, sets the saturation point of the power amplifier 200 at a relatively low input voltage level which results in nonlinear saturated operation. The peak RF input signal (at an input power in the range of 1-2 dBm), received at terminal 205 of the power amplifier 200, easily drives the power amplifier 200 into saturation. Thus, in the analog mode, high efficiency nonlinear operation is achieved.

When the dual-mode radiotelephone is operated in a digital mode, the power supply voltage Vdd is supplied at a higher voltage, e.g. 11.3 volts, during the time period of the TDMA transmit time slot. The temporary increase of the supply voltage from the power supply network 10 by the amount of the battery voltage V1 effectively increases the saturation point of the power amplifier 200 and extends the linear portion of the power transfer characteristic curve 500. As a result, nonlinear operation of the power amplifier 200 at the increased supply voltage of 11.3 volts does not occur until the RF input power reaches the saturation point in the range of 6–8 dBm. Since peak RF input signals fall in the 1–2 dBm range for typical voice communications, the power amplifier 200 operates well below saturation in the linear part of the power transfer curve 500.

As a result, for digital modes, the power amplifier 200 linearly amplifies the RF input. While such non-saturated amplifier operation has a significantly lower efficiency than saturated operation, this loss is offset somewhat by the fact that the amplifier in the digital mode is activated only a fraction of the frame time (as controlled by the square wave drive signal applied to the TDMA gate 70) as opposed to 100% of the frame time for operation in the analog mode.

Other exemplary embodiments of the power supply network which may be used to implement the present invention will now be described in conjunction with FIGS. 5(a)–5(c) and FIG. 2 in which like reference numerals refer to like elements throughout. For purposes of simplicity, only supply network 10 is shown in FIGS. 5(a)–5(c), but it is to be understood that the supply voltage Vdd generated by each of the circuits to be described in conjunction with FIGS. 5(a)–5(c) is provided to the power amplifier 200 as shown in FIG. 2.

Figure 5A:
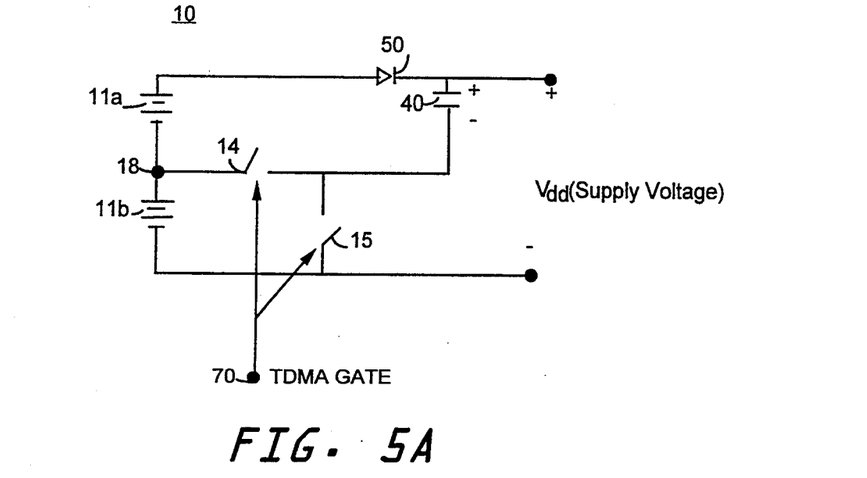
FIGS. 5(a)-5(c) are schematic drawings showing other embodiments of the power supply network used in implementing the present invention.

In FIG. 5(a), two dc voltage supplies 11a and 11b provide one-half of the voltage V1 (i.e. V/2) supplied by battery 11 in FIG. 2. The two dc voltage supplies 11a and 11b are connected in series as shown at node 18. Two complementary switches 14 and 15 are shown generically to simplify the description. However, it will be understood by those skilled in the art that switches 14 and 15 can be implemented using, for example, complementary BJT transistors as shown in FIG. 2. Of course, other suitable switching devices could also be used. Switch 14 is connected between series node 18 and the negative terminal of a capacitor 40. Switch 15 is connected between the negative terminal of voltage supply 11b and the negative terminal of capacitor In operation, complementary switches 14 and 15 are actuated according to the TDMA gate signal 70 as described above. Initially, when switch 15 is closed, capacitor charges to the combined series voltage of both dc 11a and 11b, i.e. V volts. Thereafter, switch 15 is opened, and switch 14 is closed (in response to appropriate control signals from the TDMA gate 70) so that supply voltage Vdd equals the voltage V stored by capacitor 40 plus the voltage V/2 of dc supply 11b to generate a combined series voltage of 1.5 V. As described above, diode 50 prevents discharge of the capacitor 40 after switch 14 is closed.

Thus, it is clear that by appropriate alternate operation of switches 14 and 15 in synchronization with the TDMA slot structure, two different supply voltages V and 1.5 V can be supplied to the power amplifier 200. This arrangement may be desirable in certain situations where it is advantageous to increase the supply voltage by a factor less than two (i.e. the voltage increase described in conjunction with the power supply circuit 10 in Figure 2).

Figure 5B:
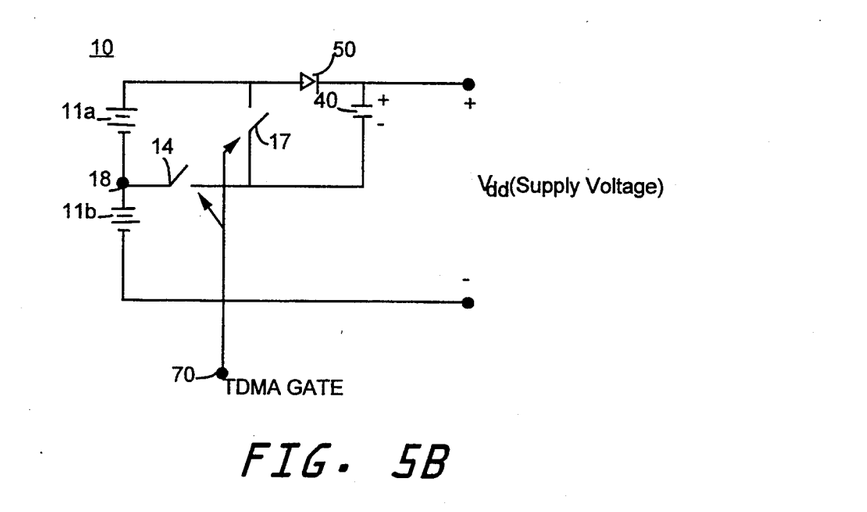
Figure 5C:
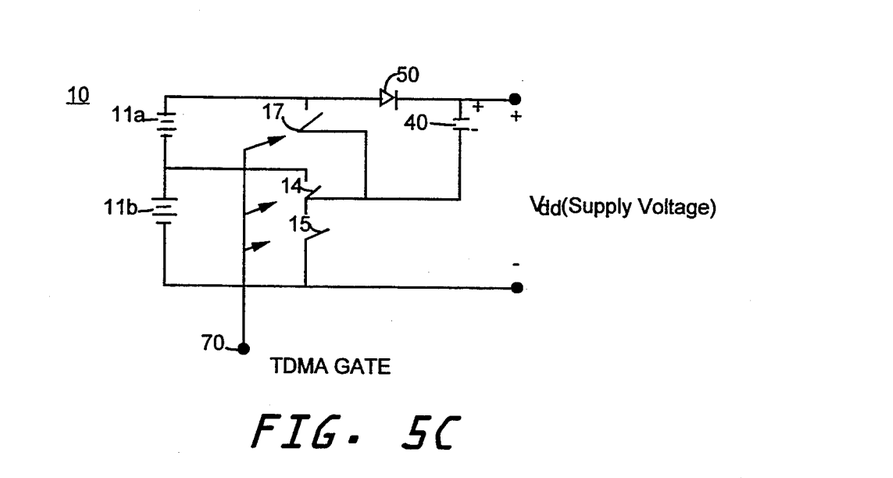

An alternative power supply circuit for achieving a temporary voltage increase by a factor less than two described now in conjunction with FIG. 5(b). Switch is connected between series node 18 and the negative terminal of capacitor 40 as in FIG. 5(a). However, a complementary switch 17 is connected between the anode of diode 50 and the negative terminal of capacitor 40. In operation, when switch 14 is closed, capacitor 40 charges to V/2 volts. When switch 14 is opened and switch 17 is closed, the supply voltage Vdd is equal to 1.5 V volts. Like the circuit shown in FIG. 5(a), complementary switches 14 and 17 may be field effect or bipolar junction transistors which are synchronously activated and deactivated in accordance with the TDMA gate signal The supply network circuits of FIG. 5(a) and 5(b) can be improved using the supply voltage circuit shown FIG. 5(c). Since in both FIGS. 5(a) and 5(b) only one of the battery supplies 11a or 11b, charges the capacitor 40, that one battery will be depleted a t a faster rate. Evenly distributed discharge of the two battery supplies, 11a, 11b is obtained in FIG. 5(c) by alternating between switching complementary switches 14 and 15 and complementary switches 14 and 17 equal amounts of time (e.g. alternate talk bursts are assigned one pair of complementary switches). Otherwise, the operation of the voltage supply circuit in FIG. 5(c) is similar to described above in conjunction with FIGS. 5(a) and 5(b).

Even though the present invention has been described in the context of a dual-mode radiotelephone, it is clear that it could also be used in single mode radiotelephones where the supply voltage Vdd provided to the power amplifier 200 is set to the appropriate voltage level to provide linear operation in the digital mode and non-linear operation in the analog mode. For example, for a digital only radiotelephone, the TDMA gate drive signal could be used to supply the appropriate level of power for linear operation only during the transmit time slots in the frame structure.

While the invention has been particularly shown described with reference to preferred embodiments thereof, it will be understood by those skilled in the art that various alterations and form in detail may be made without departing from the spirit and scope of the invention. The invention is not intended to be limited to, or by, the above description, but rather only to the extent set forth in the claims below.

What is claimed is:

1. A dual-mode portable radiotelephone comprising:
a power supply including:
  a dc voltage source;
  plural switches, connected to the dc voltage source, actuable in accordance with a drive signal to provide dc power at different voltage levels;
  a capacitor connected to the switches such that the capacitor and the dc voltage source are alternately placed in parallel across a diode and in series depending on the actuation states of the switches said diode preventing discharge of the capacitor through the switches; and
an RF power amplifier connected to the power supply wherein the rf power amplifier operable to provide liner and nonlinear amplification of a modulated RF input signal depending on the voltage level of the dc power provided by the power supply, wherein the switches are complementary transistors oppositely biased by the drive signal, including an NPN bipolar transistor and an PNP bipolar transistor, the bases of the transistors being connected to the drive signal, the emitter of the PNP transistor being connected to the dc voltage source and the anode of the diode, and the cathode of the diode being connected to the collectors of both the transistors via the capacitor.

2. The radiotelephone according to claim 1 wherein the modulated RF input signal is a time division multiplexed signal.

3. The radiotelephone according to claim 1 wherein the modulated RF input signal is frequency modulated when the radiotelephone is operated in one mode and π/4-shifted DQPSK modulated when the radiotelephone is operated in another mode.

4. The radiotelephone according to claim 1 wherein the drive signal is synchronized and activated based on a time division multiplexed signal.

5. The radiotelephone according to claim 4 wherein the drive signal is offset from the time division multiplexed signal.

6. The radiotelephone according to claim 4 wherein the drive signal is a periodic square wave having a frequency associated with the time division multiplexed signal.

7. The radiotelephone according to claim 1 wherein the RF power amplifier uses at least one GaAs field effect transistor.

8. The radiotelephone according to claim 1 wherein the RF power amplifier operates as a high efficiency nonlinear amplifier when a first voltage level dc power signal is received from the power supply and as a linear amplifier when a second voltage level dc power signal is received from the power supply.

9. The radiotelephone according to claim 1 wherein the RF power amplifier operates as a high efficiency, nonlinear amplifier when the radiotelephone operates in an analog mode and as a linear amplifier when the radiotelephone operates in a digital mode.

10. (Amended) A radiotelephone comprising:
a dual-mode power supply for providing dc power at a first voltage level in a first mode and a second voltage level in a second mode including:
   a dc voltage source;
   complementary bipolar junction transistors, connected to the dc voltage source, oppositely biased in accordance with a drive signal; and
   a capacitor connected to the transistors such that the capacitor and the dc voltage source are alternately placed in parallel across a diode and in series depending on the bias applied to the transistors;
the drive signal for determining the mode of the power supply;
an RF power amplifier connected to the power supply wherein the RF power amplifier provides nonlinear amplification of a modulated RF input signal in the first mode and linear amplification of the modulated RF input signal in the second mode, wherein the bases of the transistors are connected to the drive signal, the emitter of one of the transistors is connected to the dc voltage source and the anode of the diode, and the cathode of the diode is connected to the collectors of both the transistors via the capacitor.

11. The radiotelephone according to claim 10, wherein the modulated RF input signal is a time division multiplexed signal.

12. The radiotelephone according to claim 10, wherein the modulated RF input signal is frequency modulated when the radiotelephone is operated in one mode and π/4-shifted DQPSK modulated when the radiotelephone is operated in another mode.

13. The radiotelephone according to claim 10, wherein the drive signal is synchronized and activated based on a time division multiplexed signal.

14. The radiotelephone according to claim 11, wherein the drive signal is offset from the time division multiplexed signal.

15. The radiotelephone according to claim 11, wherein the drive signal is a periodic square wave having a frequency associated with the time division multiplexed signal.

16. The radiotelephone according to claim 11, wherein the RF power amplifier uses at least one GaAs field effect transistor.

17. The radiotelephone according to claim 10, wherein the RF power amplifier operates as a high efficiency nonlinear amplifier when the first voltage level dc power signal is received from the power supply and as a linear amplifier when second voltage level dc power signal is received from the power supply.

18. The radiotelephone according to claim 10, wherein the RF power amplifier operates as a high efficiency amplifier when the radiotelephone operates in an analog mode and as a linear amplifier when the radiotelephone operates in a digital mode.

19. The radiotelephone according to claim 10, wherein the RF power amplifier uses at least one bipolar junction transistor.

20. A power supply for providing different voltage power to an RF power amplifier in a mobile radiotelephone comprising:
a battery;
complementary bipolar transistors oppositely biased by a drive signal having two logic states, with the bases of the transistors being connected to the drive signal,
a capacitor connected between said transistors such that said capacitor and said battery are alternately placed in parallel across a diode when said drive signal is at a first logic state and in series when said drive signal is at a second logic state,
wherein the emitter of one of the transistors is connected to the battery and the anode of the diode, the cathode of the diode is connected to the collectors of both transistors via the capacitor, a first voltage is generated by the power supply when the drive signal is at said first logic state, and a second voltage is generated by the power supply when the drive signal is at said second logic state.

21. The power supply according to claim 20, wherein said transistors are bipolar transistors.

22. The power supply according to claim 20, wherein said transistors are field effect transistors.

23. The power supply according to claim 20, wherein said drive signal is a periodic square wave signal synchronized with a time division multiplexed signal.

24. A dual-mode portable radiotelephone comprising:
a power supply including:
   plural dc voltage source;
   plural switches, connected to the dc voltage sources, actuable in accordance with a drive signal to provide dc power at different voltage levels;
   a capacitor connected to the switches such that the capacitor and one of the plural dc voltage sources are placed in parallel across a diode and both of the plural dc voltage sources and the capacitor are placed in series depending on the actuation states of the switches, the diode preventing discharge of the capacitor through the switches; and an RF power amplifier connected to the power supply wherein the RF power amplifier is operable to provide linear and nonlinear amplification of a modulated RF input signal depending on the voltage level of the dc power provided by the power supply.

25. The radiotelephone according to claim 24 wherein the switches are complementary transistors oppositely biased by the drive signal.

26. A power supply for providing different voltage power to an RF power amplifier in a mobile radiotelephone comprising:

a first battery connected in series at a series node to a second battery;

complementary switches alternately actuated by a drive signal, said drive signal having two logic states; and a capacitor connected between said switches such that said capacitor and one of the first and second batteries are placed in parallel across a diode when said drive signal is at a first logic state and the capacitor and said first and second batteries are placed in series when said drive signal is at a second logic state, said diode preventing discharge of said capacitor through said switches, wherein a first voltage is generated by the power supply when the drive signal is at said first logic state and a second voltage is generated by the power supply when the drive signal is at said second logic state.

27. The power supply according to claim 26, wherein said switches are bipolar transistors.

28. The power supply according to claim 26, wherein said switches are field effect transistors.

29. The power supply according to claim 26, wherein said drive signal is a periodic square wave signal synchronized with a time division multiplexed signal.

* * * * *